(12) United States Patent
Jeong

(10) Patent No.: US 7,372,704 B2
(45) Date of Patent: May 13, 2008

(54) HEAT DISSIPATING STRUCTURE FOR IC CHIP OF PLASMA DISPLAY MODULE AND PLASMA DISPLAY MODULE HAVING THE SAME

(75) Inventor: Kwang-Jin Jeong, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/404,851

(22) Filed: Apr. 17, 2006

(65) Prior Publication Data

US 2006/0245167 A1 Nov. 2, 2006

(30) Foreign Application Priority Data

May 2, 2005 (KR) ................. 10-2005-0036696

(51) Int. Cl.
*H05K 7/20* (2006.01)
*H04N 5/64* (2006.01)

(52) U.S. Cl. ............ 361/719; 361/712; 361/714; 348/836

(58) Field of Classification Search ........ 361/702–704, 361/707, 719, 752, 712, 714; 439/485; 345/204; 348/836
See application file for complete search history.

(56) References Cited

U.S. PATENT DOCUMENTS

| | | | | |
|---|---|---|---|---|
| 6,366,264 | B1* | 4/2002 | Kurumada | 345/60 |
| 6,522,543 | B2* | 2/2003 | Kurihara et al. | 361/704 |
| 6,534,722 | B2* | 3/2003 | Takaoka | 174/254 |
| 6,597,113 | B1* | 7/2003 | Nitta | 313/581 |
| 6,657,620 | B2* | 12/2003 | Oishi et al. | 345/204 |
| 6,677,664 | B2* | 1/2004 | Inoue et al. | 257/668 |
| 6,703,702 | B2* | 3/2004 | Inoue et al. | 257/684 |
| 6,972,963 | B1* | 12/2005 | Chou | 361/760 |
| 7,034,220 | B2* | 4/2006 | Kim et al. | 361/816 |
| 7,064,952 | B1* | 6/2006 | Chen et al. | 361/681 |

(Continued)

FOREIGN PATENT DOCUMENTS

KR   10-2005-0034379   4/2005

(Continued)

OTHER PUBLICATIONS

Korean Office Action for corresponding Korean Patent Application No. 2005-0036696, issued on Oct. 31, 2006.

*Primary Examiner*—Anatoly Vortman
*Assistant Examiner*—Bradley H Thomas
(74) *Attorney, Agent, or Firm*—Robert E. Bushnell, Esq.

(57) ABSTRACT

A heat dissipating structure for an IC chip of a plasma display module, and a plasma display module having the same with improved heat dissipating performance of the IC chip while preventing the spread of foreign matter emanating from the heat-dissipating sheet. The structure includes a chassis including a chassis bending part and a chassis base, the IC chip contacting the chassis bending part and connected to a signal transmitting member, a cover plate arranged on the chassis bending part and facing the IC chip, a chip heat-dissipating sheet arranged between the IC chip and the cover plate, the chip-heat dissipating sheet made out of graphite and a thermally conductive member also arranged between the IC chip and the cover plate, the thermally conductive member adapted to contact and cover the chip heat-dissipating sheet.

24 Claims, 6 Drawing Sheets

U.S. PATENT DOCUMENTS

| | | | |
|---|---|---|---|
| 2003/0058230 A1* | 3/2003 | Ide | 345/204 |
| 2005/0047067 A1* | 3/2005 | Bang et al. | 361/681 |
| 2005/0067963 A1* | 3/2005 | Kim et al. | 313/583 |
| 2005/0078446 A1* | 4/2005 | Bae | 361/687 |
| 2005/0079304 A1 | 4/2005 | Clovesko et al. | |
| 2005/0083646 A1* | 4/2005 | Bae et al. | 361/686 |
| 2006/0098413 A1* | 5/2006 | Capp et al. | 361/705 |
| 2006/0171124 A1* | 8/2006 | Capp et al. | 361/705 |

FOREIGN PATENT DOCUMENTS

KR   10-2005-0038952   4/2005

* cited by examiner

_US 7,372,704 B2_

HEAT DISSIPATING STRUCTURE FOR IC CHIP OF PLASMA DISPLAY MODULE AND PLASMA DISPLAY MODULE HAVING THE SAME

CLAIM OF PRIORITY

This application makes reference to, incorporates the same herein, and claims all benefits accruing under 35 U.S.C. § 119 from an application for STRUCTURE FOR HEAT DISSIPATION OF INTEGRATED CIRCUIT CHIP OF PLASMA DISPLAY MODULE AND PLASMA DISPLAY MODULE COMPRISING THE SAME earlier filed in the Korean Intellectual Property Office on 2 May 2005 and there duly assigned Serial No. 10-2005-0036696.

BACKGROUND OF THE INVENTION

1. Field of the Invention

The present invention relates to a heat dissipating structure for an integrated circuit (IC) chip in a plasma display module, where the heat dissipating performance of the IC chip is improved while preventing the spread of foreign material throughout the module from the heat dissipating structure.

2. Description of the Related Art

Plasma display devices are widely considered to be the best replacement for conventional cathode ray tube (CRT) display devices. A plasma display device contains a discharge gas sealed between two substrates on which a plurality of electrodes are formed. In a plasma display device, a voltage is applied to the electrodes to generate discharge which excites a phosphor material to generate visible light.

The plasma display device includes a plasma display module, which commonly includes a plasma display panel and a driving device for driving the plasma display panel. The driving device includes circuit elements mounted on a circuit board that are electrically connected to the plasma display panel using a signal transmitting member. The signal transmitting member includes a plurality of conductive lines, and at least a portion of the conductive lines pass through an IC chip.

When the plasma display panel is driven, the IC chip generates a lot of heat. A conventional heat dissipating structure for the IC chip cannot effectively dissipate this heat, leading to a reduction in performance and lifespan of the IC chip. Thus, it has become necessary to develop a heat dissipating structure for an IC chip that can effectively dissipate heat from the IC chip.

Also, the heat dissipating structure includes materials having high thermal conductivity. However, such materials can also be apt to generate foreign material. If this foreign material spreads throughout the plasma display device, many problems can occur, such as short circuiting. Therefore, what is also needed is a heat dissipating structure that prevents against the negative effects of foreign material.

SUMMARY OF THE INVENTION

It is therefore an object of the present invention to provide an improved design for a plasma display module.

It is also an object of the present invention to provide an improved heat dissipating structure for a plasma display module.

It is further an object of the present invention to provide an improved heat dissipating structure for an IC chip located on a signal transmitting member that delivers signals that drives a plasma display panel in a plasma display module.

It is still the object of the present invention to provide a heat dissipating structure for a plasma display module that does not produce graphite foreign material.

It is yet an object of the present invention to provide a heat dissipating structure for an integrated circuit (IC) chip of a plasma display module, and a plasma display module having the same, that can improve the heat dissipating performance of the IC chip while preventing contamination by a chip heat-dissipating sheet by installing a thermally conductive member covering the chip heat-dissipating sheet.

According to an aspect of the present invention, there is provided a heat dissipating structure for an integrated circuit (IC) chip of a plasma display module and a plasma display module having the same, the structure including a chassis including a chassis bending part and a chassis base, the chassis bending part being integral with the chassis base, the IC chip contacting the chassis bending part and connected to a signal transmitting member, a cover plate arranged on the chassis bending part and facing the IC chip, a chip heat-dissipating sheet arranged between the IC chip and the cover plate, the chip-heat dissipating sheet being made of graphite and a thermally conductive member also arranged between the IC chip and the cover plate, the thermally conductive member adapted to contact and cover the chip heat-dissipating sheet.

The chassis bending part can be arranged at an edge of the chassis. The signal transmitting member can include a tape carrier package (TCP). The chip heat-dissipating sheet can include one adhesive surface. The thermally conductive member can be a foil.

The chip heat-dissipating sheet can be arranged to contact the cover plate, the thermally conductive member can be adapted to form a space with the cover plate and can be adapted to accommodate the chip heat-dissipating sheet, and at least a portion of the thermally conductive member can contact the IC chip.

The chip heat-dissipating sheet can be arranged to contact the IC chip, the thermally conductive member can be adapted to form a space with the signal transmitting member and can be adapted to accommodate the chip heat-dissipating sheet, and at least a portion of the thermally conductive member can contact the cover plate.

The heat-dissipating sheet can be arranged to contact the IC chip, the thermally conductive member can be adapted to form a space with the IC chip and can be adapted to accommodate the chip heat-dissipating sheet, and at least a portion of the thermally conductive member can contact the cover plate.

The thermally conductive member can be copper. The thermally conductive member can be aluminum. The thermally conductive member can have one adhesive surface. The heat dissipating structure can further include a thermal grease arranged between the IC chip and the chassis bending part of the chassis.

According to another aspect of the present invention, there is provided a heat dissipating structure for an integrated circuit (IC) chip of a plasma display module and a plasma display module having the same, the structure including a chassis including a reinforcing member and a chassis base, the reinforcing member being separate from and attached to the chassis base, the IC chip contacting the reinforcing member and connected to a signal transmitting member, a cover plate arranged on the reinforcing member and facing the IC chip, a chip heat-dissipating sheet arranged between the IC chip and the cover plate, the chip-heat dissipating sheet being made of graphite and a thermally conductive member also arranged between the IC chip and the cover plate, the thermally conductive member adapted to contact and cover the chip heat-dissipating sheet.

The reinforcing member can be made out of a material different from that of the chassis base. The reinforcing member can be arranged at an edge of the chassis. The signal transmitting member can include a tape carrier package (TCP). The chip heat-dissipating sheet can include one adhesive surface. The thermally conductive member can be a foil.

The chip heat-dissipating sheet can be arranged to contact the cover plate, the thermally conductive member can be adapted to form a space with the cover plate and can be adapted to accommodate the chip heat-dissipating sheet, and at least a portion of the thermally conductive member can contact the IC chip.

The chip heat-dissipating sheet can be arranged to contact the IC chip, the thermally conductive member can be adapted to form a space with the signal transmitting member and can be adapted to accommodate the chip heat-dissipating sheet, and at least a portion of the thermally conductive member can contact the cover plate.

The heat-dissipating sheet can be arranged to contact the IC chip, the thermally conductive member can be adapted to form a space with the IC chip and can be adapted to accommodate the chip heat-dissipating sheet, and at least a portion of the thermally conductive member can contact the cover plate.

The thermally conductive member can be copper. The thermally conductive member can be aluminum. The thermally conductive member can have one adhesive surface. The heat dissipating structure can further include a thermal grease arranged between the IC chip and the reinforcing member of the chassis.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
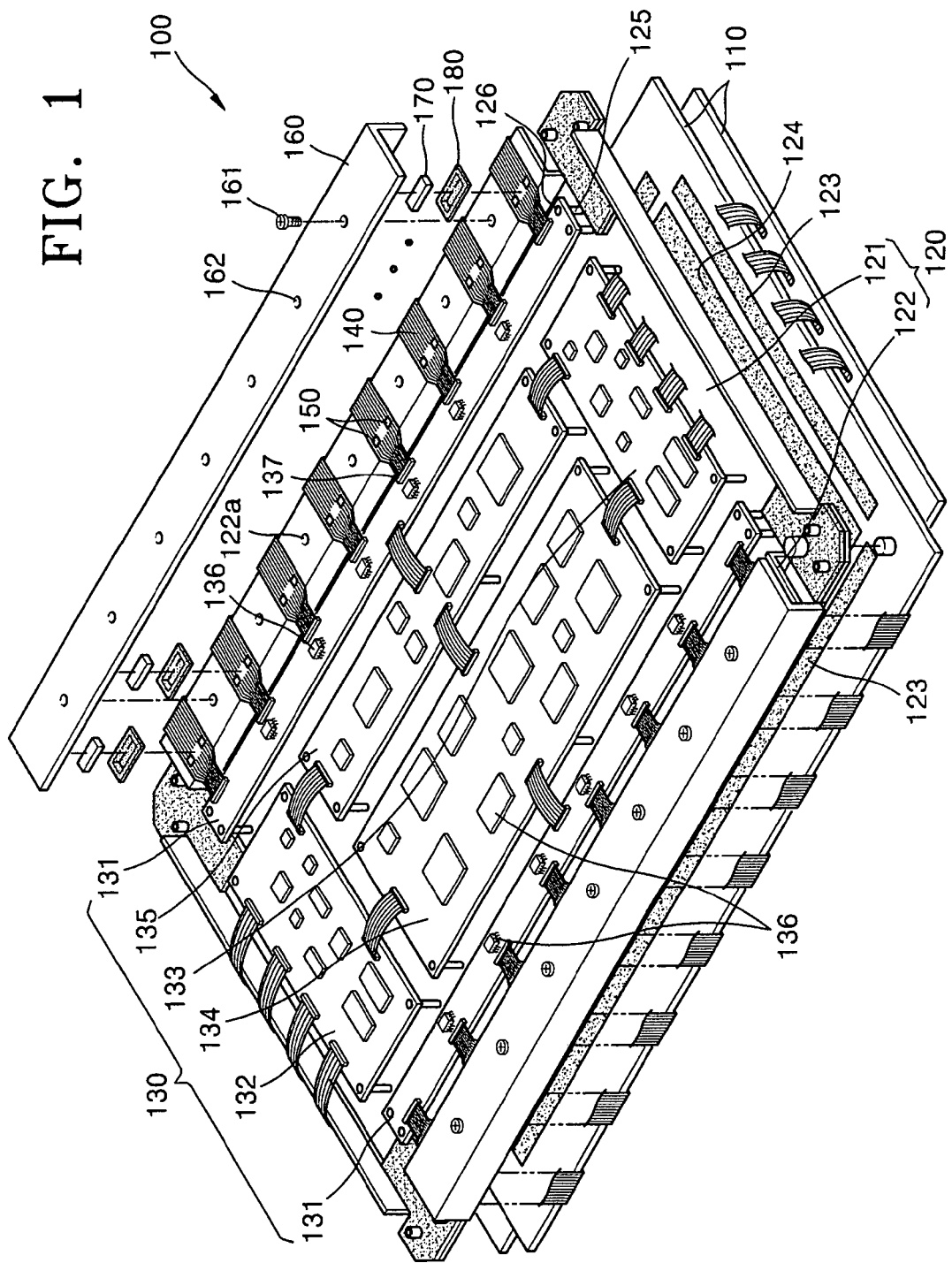
FIG. 1 is an exploded perspective view of a plasma display module that includes a heat dissipating structure for an IC chip according to a first embodiment of the present invention.
Figure 2:
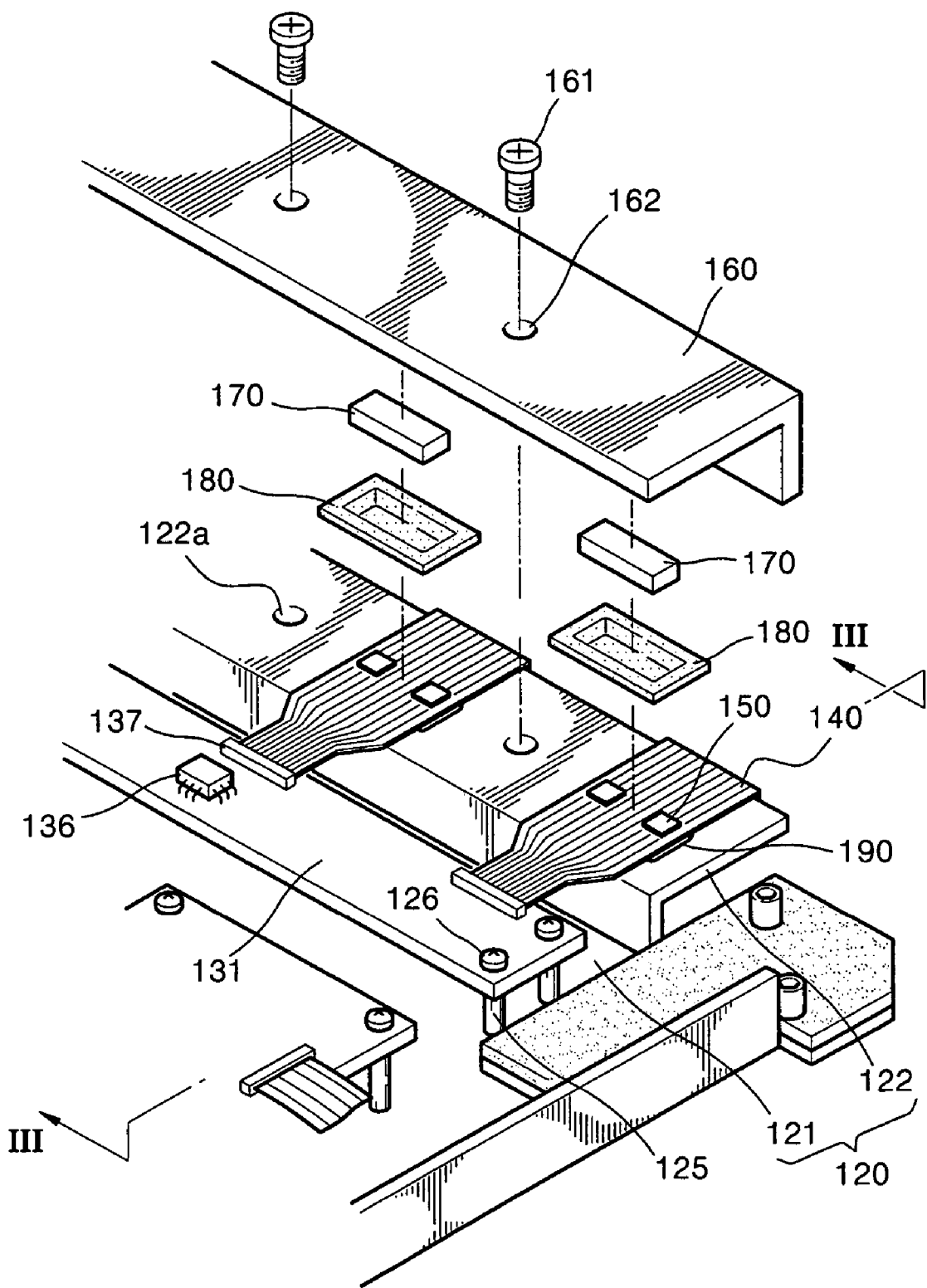
FIG. 2 is an exploded perspective view of a portion of the chassis bending part of the plasma display panel of FIG. 1.
Figure 3:
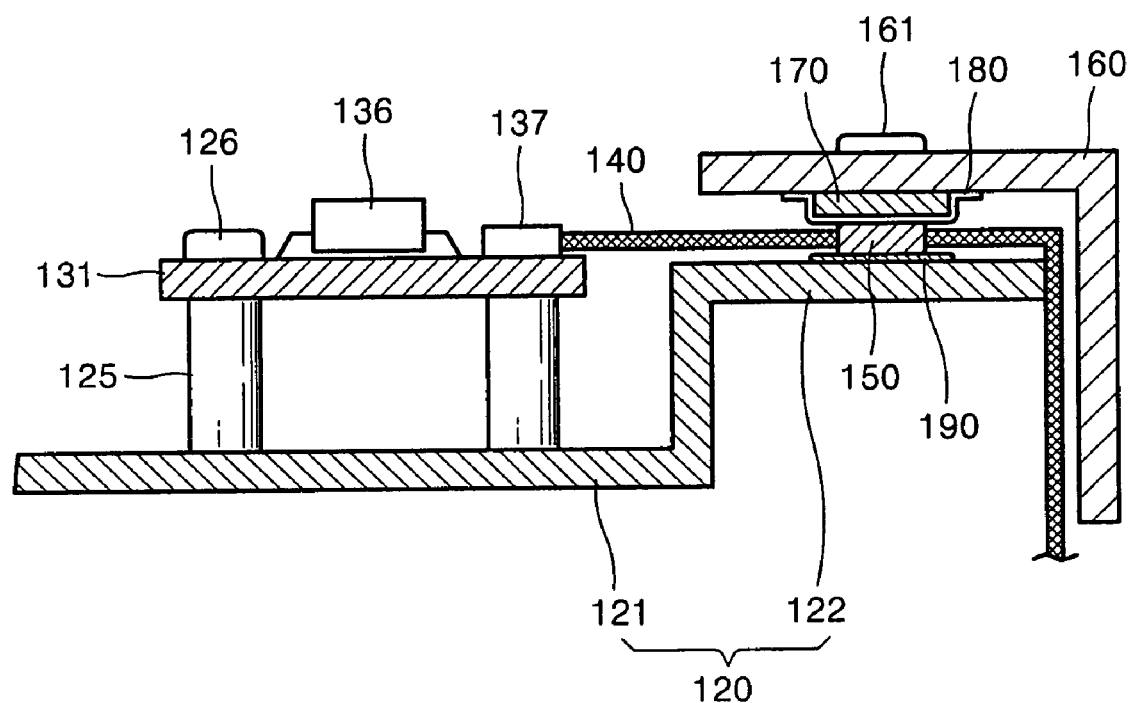
FIG. 3 is a magnified cross-sectional view taken along line III-III of FIG. 2.

Turning now to FIGS. 1 through 3, FIG. 1 is an exploded perspective view of a plasma display module 100 having a heat dissipating structure for an IC chip according to a first embodiment of the present invention, FIG. 2 is an exploded perspective view of a portion of the chassis bending part 122 of the plasma display module 100 of FIG. 1, and FIG. 3 is a magnified cross-sectional view of the chassis bending part 122 of FIG. 2 taken along line III-III. As shown in FIG. 1, the plasma display module 100 includes a plasma display panel 110, a chassis 120, circuit boards 130, a signal transmitting member 140, an integrated circuit (IC) chip 150, a cover plate 160, a chip heat-dissipating sheet 170, and a thermally conductive member 180.

The plasma display panel 110 is mounted on the front surface of the chassis 120, using a double-sided adhesive means 123 such as double sided tape attached to the rear surface of the plasma display panel 110. A panel heat-dissipating sheet 124 made of a material having a high thermal conductivity, is installed between the plasma display panel 110 and the chassis 120 and serves to dissipate heat generated during the operation of the plasma display panel 110. The chassis 120 is made of aluminum and includes a chassis base 121 and a chassis bending part 122. The chassis base 121 is located on the center of the chassis 120 and has a boss 125 formed thereon. The chassis bending part 122 is located at an edge of the chassis 120 and is formed by being bent to a level of the circuit boards 130.

The circuit boards 130 are composed of address electrode buffer circuit boards 131, an X electrode driving circuit board 132, a Y electrode driving circuit board 133, a power supply board 134, and a logic control board 135, each of boards 131, 132, 133, 134 and 135 having a plurality of circuit elements 136. The circuit boards 130 are installed on the chassis base 121 using the boss 125 and a bolt 126. A connector 137 is disposed on the circuit boards 130 and electrically connects the circuit boards 130 to the signal transmitting member 140. The signal transmitting member 140 transfers an address signal and passes over the chassis bending part 122. One end of the signal transmitting member 140 is connected to a connector 137 on the address electrode buffer circuit board 131, and the other end is connected to the plasma display panel 110. The signal transmitting member 140 electrically connects the plasma display panel 110 to the address electrode buffer circuit boards 131, and the signal transmitting member 140 can be a tape carrier package (TCP).

The IC chip 150 is mounted on the chassis bending part 122 and controls electrical signals on the signal transmitting member 140 by being connected to the signal transmitting member 140. Thermal grease 190 is arranged between the IC chip 150 and the chassis bending part 122.

While the first embodiment includes thermal grease 190 being arranged between the IC chip 150 and the chassis bending part 122, the present invention is in no way limited to this. That is, the heat dissipating structure for an IC chip can have the IC chip 150 directly contacting the chassis bending part 122 without thermal grease.

The cover plate 160 is mounted on the chassis bending part 122 to protect the signal transmitting member 140 and the IC chip 150 and to draw away heat generated by the IC chip 150. A chip heat-dissipating sheet 170 is installed between the IC chip 150 and the cover plate 160 to transfer heat from the IC chip 150 to the cover plate 160. The chip heat-dissipating sheet 170 is made out of graphite which has a superior thermal conductivity. The chip heat dissipating sheet 170 can also have one adhesive surface. The chip heat-dissipating sheet 170 is manufactured in a tape form by forming a shape of a chip heat-dissipating sheet with graphite and spreading a strong adhesive on one surface of the chip heat-dissipating sheet 170. The chip heat-dissipating sheet 170 can then be easily attached without a separate adhesive agent.

While the chip heat-dissipating sheet 170 of the first embodiment is made out of graphite, the present invention is in no way limited to this. That is, the chip heat-dissipating sheet 170 of the present invention can be formed by mixing graphite and different materials having excellent thermal conductivity.

While one surface of the chip heat-dissipating sheet 170 of the first embodiment has an adhesive surface, the present invention is in no way limited to this. That is, the chip heat-dissipating sheet 170 of the present invention can be attached by spreading an adhesive agent on all or a portion of each chip heat-dissipating sheet 170 whenever attachment is necessary, instead of pre-spreading adhesive on the chip heat-dissipating sheet 170.

The thermally conductive member 180 is located between the IC chip 150 and the chip heat-dissipating sheet 170. The thermally conductive member 180 is made out of aluminum and can take the form of a foil. The thermally conductive member 180 forms a sealed space with the cover plate 160 that accommodates the chip heat-dissipating sheet 170. That is, since the thermally conductive member 180 has an area that is wider than the chip heat-dissipating sheet 170, the chip heat-dissipating sheet 170 is isolated from the outside of the thermally conductive member 180 and the cover plate 160. With such a design, foreign material of graphite powder generated by the chip heat-dissipating sheet 170 cannot move to the outside of the thermally conductive member 180 and the cover plate 160.

While the chip heat-dissipating sheet 170 of the first embodiment is installed to contact the cover plate 160, and the thermally conductive member 180 forms the space with the cover plate 160 for accommodating the chip heat-dissipating sheet 170, the present invention is not limited to this exact design. For example, the chip heat-dissipating sheet 170 of the present invention can instead be installed to contact the IC chip 150, and the thermally conductive member 180 can form a space with the signal transmitting member 140 or the IC chip 150 instead of the cover plate for accommodating the chip heat-dissipating sheet 170.

While the material of the thermally conductive member 180 of the first embodiment is preferably aluminum, the present invention is in no way so limited. For example, the thermally conductive member 180 of the present invention can be made of a different thermally conductive metal, or even a synthetic resin having excellent thermal conductivity.

While the thermally conductive member 180 of the first embodiment is preferably a foil, the present invention is in no way so limited. For example, the thermally conductive member 180 of the first embodiment of the present invention can have other various other designs that can efficiently transfer heat to or from the chip heat-dissipating sheet 170.

A discussion of the assembly process of the heat dissipating structure for an IC chip according to the first embodiment of the present invention will now be described. The installer installs the signal transmitting member 140 and the IC chip 150 on the chassis bending part 122, attaches the chip heat-dissipating sheet 170 to the rear surface of the cover plate 160, and fixes the thermally conductive member 180 to the cover plate 160 to cover the chip heat-dissipating sheet 170. The installer assembles the cover plate 160 to the chassis bending part 122 by passing a fixing bolt 161 through a fixing hole 162 and combining the fixing bolt 161 with a female nut 122a of the chassis bending part 122.

A process of operating the plasma display module 100 having the heat dissipating structure for an IC chip according to the first embodiment of the present invention and a transfer path of heat generated by the IC chip 150 will now be described. When plasma display module 100 operates, the circuit boards 130 are driven, and a voltage is applied to the plasma display panel 110. When the voltage is applied to the plasma display panel 110, address discharge and sustain discharge occur, and the energy level of discharge gas excited during the sustain discharge drops, thus emitting ultraviolet rays. The ultraviolet rays excite a phosphor layer in discharge cells, and when the energy level of the excited phosphor layer drops, visible light is emitted to form an image.

During this light producing process, a lot of heat is generated by the IC chip 150 mounted on the chassis bending part 122. Part of the heat generated by the IC chip is transferred to the chassis bending part 122 via the thermal grease 190, and the rest of the heat is transferred to the cover plate 160 via the thermally conductive member 180 and the chip heat-dissipating sheet 170. Because the chip heat-dissipating sheet 170 is made out of graphite, heat generated by the IC chip 150 effectively transfers to the cover plate 160. The heat generated by the IC chip 150 and transferred to the cover plate 160 is directly transferred to ambient air surrounding the cover plate 160 via convective heat transfer.

The graphite in the chip heat-dissipating sheet 170 is both electrically conductive and thermally conductive, but can cause short circuits or other problems if foreign material released therefrom is allowed to contaminate the circuit boards 130. However, as described above, the thermally conductive member 180 of the first embodiment prevents these problems by forming the sealed space with the cover plate 160 for accommodating the chip heat-dissipating sheet 170.

The plasma display module 100 having the heat dissipating structure for an IC chip according to the first embodiment can improve the heat dissipating performance of the IC chip 150 while simultaneously solving the problem of graphite contamination, by using the chip heat-dissipating sheet 170 made of highly conductive graphite, and installing the thermally conductive member 180 to fully cover the chip heat-dissipating sheet 170.

Figure 4:
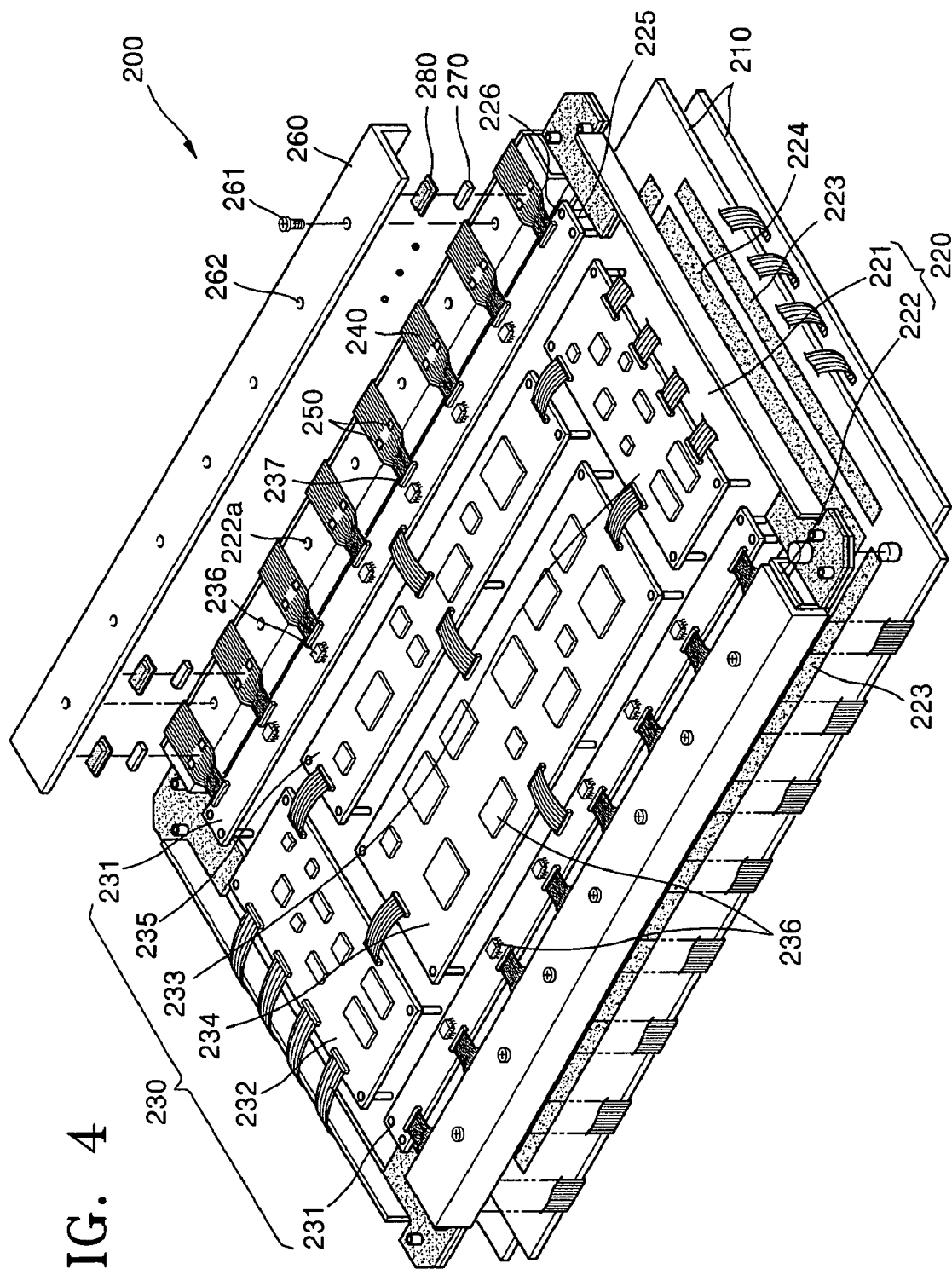
FIG. 4 is an exploded perspective view of a plasma display module that includes a heat dissipating structure for an IC chip according to a second embodiment of the present invention.
Figure 5:
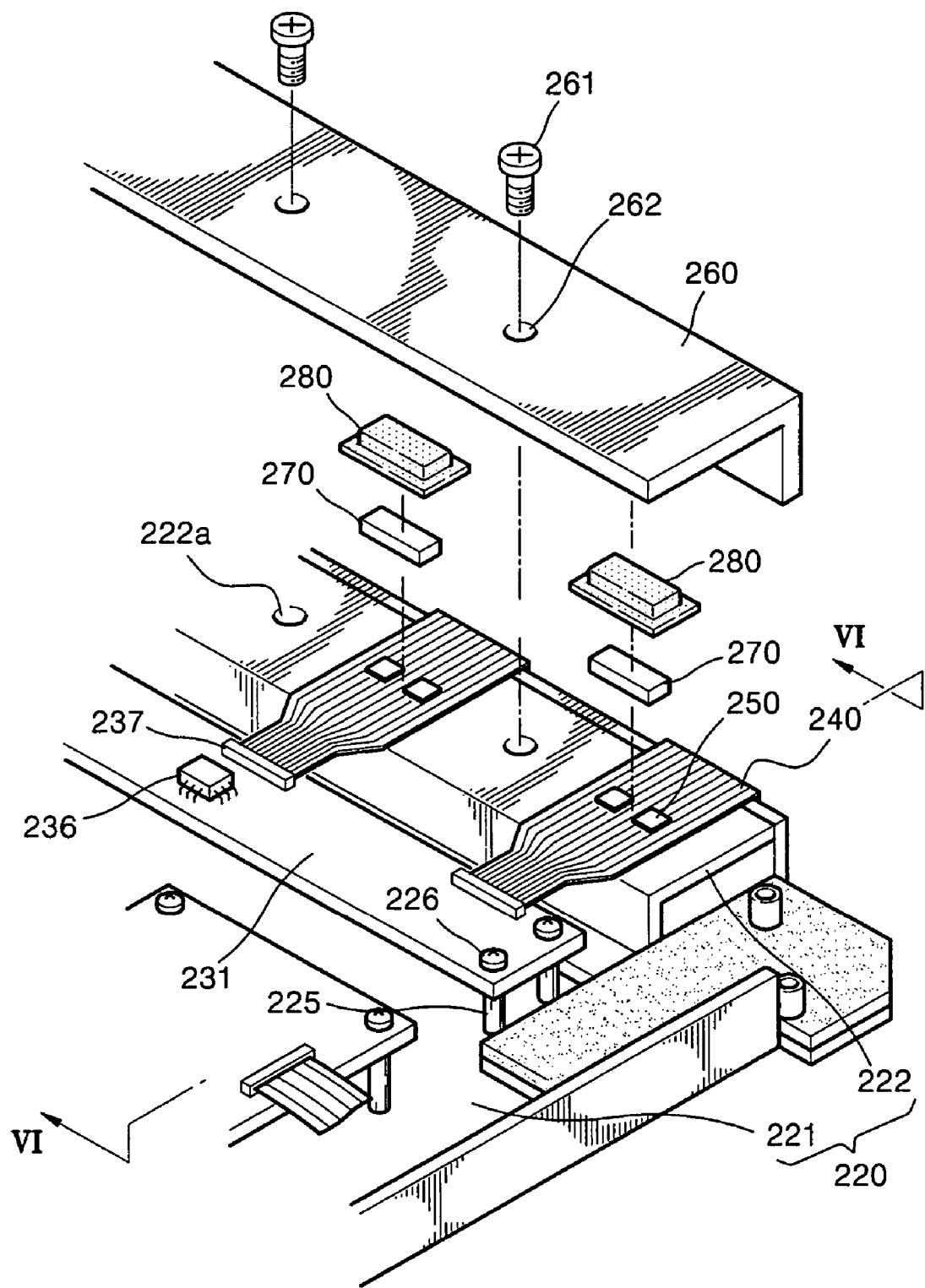
FIG. 5 is an exploded perspective view of a portion of the reinforcing member of the plasma display panel of FIG. 4.
Figure 6:
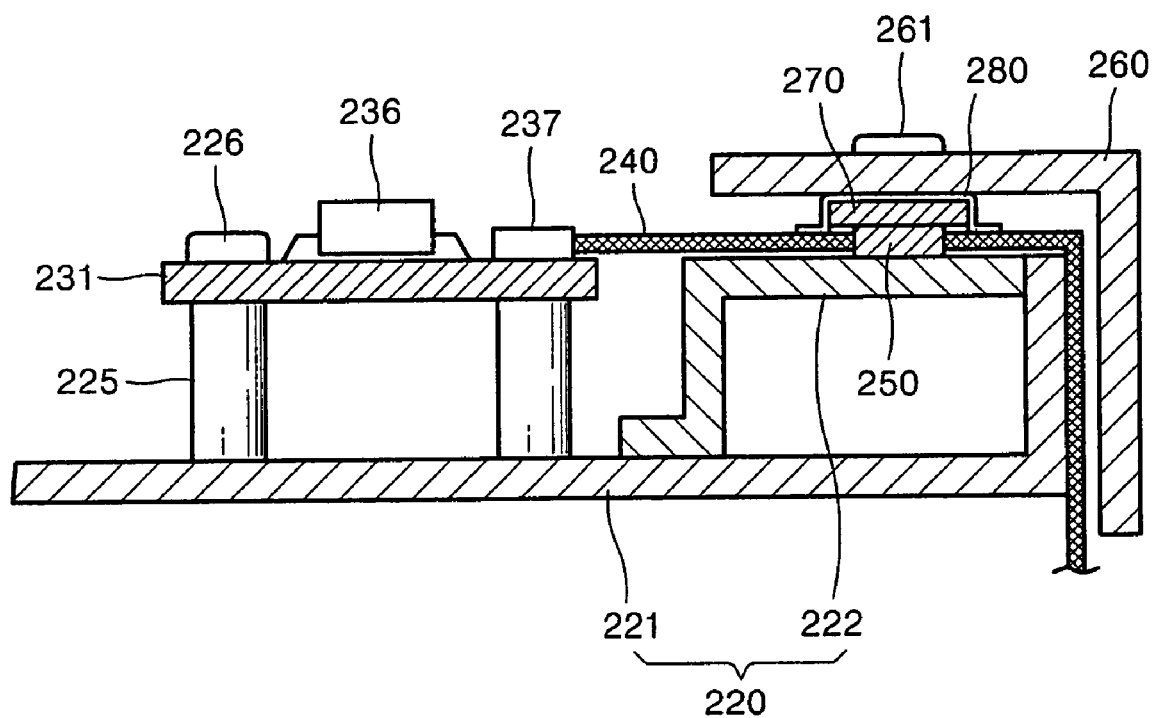
FIG. 6 is a magnified cross-sectional view taken along line VI-VI of FIG. 5.

Turning now to FIGS. 4 through 6, FIGS. 4 through 6 illustrate a plasma display module 200 according to the second embodiment of the present invention. Specifically, FIG. 4 is an exploded perspective view of a plasma display module 200 having a heat dissipating structure for an IC chip according to a second embodiment of the present invention, FIG. 5 is an exploded perspective view of a portion of reinforcing member 222 of the plasma display module 200 of FIG. 4, and FIG. 6 is a magnified cross-sectional view of FIG. 5 taken along VI-VI.

As shown in FIG. 4, the plasma display module 200 includes a plasma display panel 210, a chassis 220, circuit boards 230, a signal transmitting member 240, an IC chip 250, a cover plate 260, a chip heat-dissipating sheet 270, and a thermally conductive member 280. The plasma display panel 210 is mounted on the front surface of the chassis 220 using a double-sided adhesive means 223 such as double-sided tape attached to the rear surface of the plasma display panel 210.

A panel heat-dissipating sheet 224 having a superior thermal conductivity is installed between the plasma display panel 210 and the chassis 220 to dissipate heat generated during the operation of the plasma display panel 210. The chassis 220 is made out of aluminum and includes a chassis base 221 and a reinforcing member 222.

The chassis base 221 is located at the center of the chassis 220, and has a boss 225 formed on the chassis base 221. The reinforcing member 222 is located at the edge of the chassis 220, and is formed to the level of the circuit boards 230 mounted on the chassis base 221. The reinforcing member 222 of this second embodiment differs from the chassis bending part 122 of the first embodiment for the following reasons.

The reinforcing member 222 is different from the chassis bending part 122 in part due to the process used to make the chassis. The chassis bending part 122 is formed by bending the edge of the chassis 120 while the reinforcing member 222 is formed separately from the chassis base 221 and is later mounted on the chassis base 221. This is especially significant when the chassis 220 is made out of a material that can not be bent. For example, chassis 220 can be made out of plastic, which is a material that cannot be bent by external force. Such a plastic chassis 220 is lighter than a chassis made out of metal. A separate plastic reinforcing member 222 can be attached to a plastic chassis base 221 to complete the lightweight chassis 220.

Alternatively, the chassis base 221 and the reinforcing member 222 can be made out of different materials respectively for the chassis' rigidity. In these cases, it is preferable that the reinforcing member 222, which is made out of a different material than that of the chassis base 221, is substituted for the chassis bending part 122. Thus, the second embodiment can provide the above advantages over that of the first embodiment In the second embodiment, the circuit boards 230 include address electrode buffer circuit boards 231, an X electrode driving circuit board 232, a Y electrode driving circuit board 233, a power supply board 234, and a logic control board 235. Each of the circuit boards 230 include a plurality of circuit elements 236. The circuit boards 231, 232, 233, 234 and 235 are installed on the chassis base 221 using the boss 225 and a bolt 226, and are electrically connected to the signal transmitting member 240 by a connector 237.

The signal transmitting member 240 transfers an address signal and passes over the reinforcing member 222. One end of the signal transmitting member 240 is connected to the connector 237 on the address electrode buffer circuit board 231, and the other end is connected to the plasma display panel 210. The signal transmitting member 240 can be a tape carrier package (TCP).

The IC chip 250 is mounted on the reinforcing member 222 and controls electrical signals by being connected to the signal transmitting member 240. The cover plate 260 is mounted on the reinforcing member 222, to protect the signal transmitting member 240 and the IC chip 250 and emit heat generated by the IC chip 250. The chip heat-dissipating sheet 270 is installed between the IC chip 250 and the cover plate 260 and transfers heat from the IC chip 250 to the cover plate 260. The chip heat-dissipating sheet 270 is made out of graphite and has one adhesive surface as in the first embodiment. Thus, an installer can easily attach the chip heat-dissipating sheet 270 to the upper surface of the IC chip 250 using the adhesive surface.

The thermally conductive member 280 is located between the cover plate 260 and the chip heat-dissipating sheet 270. The thermally conductive member 280 is preferably made out of copper and preferably is in the form of a foil. The thermally conductive member 280 has one adhesive surface. Therefore, like the chip heat-dissipating sheet 270, an installer can easily install the thermally conductive member 280 using its adhesive surface.

The thermally conductive member 280 forms a sealed space with the signal transmitting member 240 that accommodate the chip heat-dissipating sheet 270. That is, since the thermally conductive member 280 has an area wider than the chip heat-dissipating sheet 270, the chip heat-dissipating sheet 270 is isolated from an outside of the thermally conductive member 280 because the thermally conductive member 280 covers the entire chip heat-dissipating sheet 270 and the thermally conductive member 280 is attached to the signal transmitting member 240. Therefore, while foreign material of graphite powder is still generated by the chip heat-dissipating sheet 270, the foreign material cannot move outside the thermally conductive member 280 and the signal transmitting member 240.

In FIGS. 4 through 6, the IC chip 250 is shown to be smaller than the chip heat-dissipating sheet 270. In this scenario, the chip heat-dissipating sheet 270 entirely covers the IC chip 250. As a result, the thermally conductive member 280 is attached only to the signal transmitting member 240 and not to the IC chip 250 when the thermally conductive member 280 entirely covers the chip heat-dissipating sheet 270. It is to be appreciated that the second embodiment of the present invention is not limited to this scenario. That is, the chip heat-dissipating sheet 270 of the present invention can instead be made to be smaller than the IC chip 250. In this new scenario, the thermally conductive member 280 can be adequately attached to the IC chip 250 even if the thermally conductive member 280 entirely covers the chip heat-dissipating sheet 270. Also it is to be understood that the thermally conductive member 280 may have other orientations than that illustrated in FIGS. 4 and 5. For example, a variation of the second embodiment within the scope of the present invention is to have the thermally conductive member 280 lie between the IC chip 250 and the chip heat-dissipating sheet 270 instead of being between the chip heat-dissipating sheet 270 and the cover plate 260.

Thus, an installer can form the heat dissipating structure for an IC chip according to the second embodiment using the method described below. The installer installs the signal transmitting member 240 and the IC chip 250 on the reinforcing member 222, attaches the chip heat-dissipating sheet 270 to the IC chip 250, and fixes the thermally conductive member 280 to the signal transmitting member 240 to cover the chip heat-dissipating sheet 270. The installer then assembles the cover plate 260 to the reinforcing member 222 by passing a fixing bolt 261 through a fixing hole 262 and combining the fixing bolt 261 with a female nut 222a of the reinforcing member 222.

Since the process of operating the plasma display module 200 having the heat dissipating structure for an IC chip according to the second embodiment is the same as the case of the first embodiment described above, the description will not be repeated.

A transfer path of heat generated by the IC chip 250 of the heat dissipating structure for an IC chip according to the second embodiment will now be described. When the plasma display panel 210 is driven, a lot of heat is generated by the IC chip 250. Part of this heat is transferred to the reinforcing member 222 attached to the IC chip 250, and the rest is of this heat is transferred to the cover plate 260 via the chip heat-dissipating sheet 270 and the thermally conductive member 280. In this case, since the chip heat-dissipating sheet 270 is made of graphite, the heat generated by the IC chip 250 is effectively transferred to the cover plate 260. The heat generated by the IC chip 250 and transferred to the cover plate 260 is directly transferred to ambient air surrounding the cover plate 260 by convective heat transfer.

The graphite of the chip heat-dissipating sheet 270 has superior electrical conductivity and superior thermal conductivity, but could cause short circuits or other problems if allowed to contaminate the circuit boards 230. However, as described above, the thermally conductive member 280 of the second embodiment prevents foreign material from the chip heat-dissipating sheet 270 from escaping because a sealed space between the signal transmitting member 240 and the thermally conductive member 280 accommodates the chip heat-dissipating sheet 270.

The plasma display module 200 having the heat dissipating structure for an IC chip according to the second embodiment can improve the heat dissipating performance of the IC chip 250 while solving the problem of graphite contamination by using the chip heat-dissipating sheet 270 made of highly conductive graphite, and installing the thermally conductive member 280 to fully cover the chip heat-dissipating sheet 270.

As described above, according to embodiments of the present invention, by installing a chip heat-dissipating sheet including graphite, whose thermal conductivity is excellent, and installing a thermally conductive member covering the chip heat-dissipating sheet, the heat dissipating performance of an IC chip can be improved, and contamination by foreign material emanating from the chip heat-dissipating sheet can be prevented. In addition, by improving the heat dissipating performance of the IC chip, the performance and life span of the IC chip can be increased, and a plasma display module can be stably driven.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A display apparatus, comprising:
a chassis comprising a chassis bending part and a chassis base, the chassis bending part being integral with the chassis base;
a display panel mounted on a front surface of the chassis base;
a plurality of circuit boards arranged on a rear side of the chassis base, each of the plurality of circuit boards including a plurality of circuit elements;
an integrated circuit chip (IC chip) contacting the chassis bending part and connected to a signal transmitting member, the signal transmitting member electrically connecting the display panel to one of the plurality of circuit boards;
a cover plate arranged on the chassis bending part and facing the IC chip;
a chip heat-dissipating sheet arranged between the IC chip and the cover plate, the chip-heat dissipating sheet comprising graphite, the chip heat-dissipating sheet being adapted to draw heat away from the IC chip; and
a thermally conductive member also arranged between the IC chip and the cover plate, the thermally conductive member and another member defining a sealed space enclosing the chip heat-dissipating sheet within, the sealed space preventing particles from the chip heat-dissipating sheet from escaping to an outside of the sealed space and reaching circuit elements on one of the plurality of circuit boards.

2. The apparatus of claim 1, wherein the chassis bending part is arranged at an edge of the chassis.

3. The apparatus of claim 1, wherein the chip heat-dissipating sheet comprises one adhesive surface.

4. The apparatus of claim 1, wherein the thermally conductive member is a foil.

5. The apparatus of claim 1, wherein the chip heat-dissipating sheet is between the thermally conductive member and the cover plate, and at least a portion of the thermally conductive member contacts the IC chip.

6. The apparatus of claim 1, wherein the another member is the signal transmitting member.

7. The apparatus of claim 1, wherein the another member is the IC chip.

8. The apparatus of claim 1, wherein the thermally conductive member comprises copper.

9. The apparatus of claim 1, wherein the thermally conductive member comprises aluminum.

10. The apparatus of claim 1, wherein the thermally conductive member comprises one adhesive surface.

11. The apparatus of claim 1, further comprising a thermal grease arranged between the IC chip and the chassis bending part of the chassis.

12. A plasma display module, comprising:
a plasma display panel adapted to display visible images via gas discharge;
a chassis adapted to support the plasma display panel, the chassis comprising a chassis bending part and a chassis base, the chassis bending part being integral with the chassis base;
an integrated circuit chip (IC chip) contacting the chassis bending part;
a signal transmitting member connected to the IC chip and adapted to deliver electrical signals to the plasma display panel to drive the plasma display panel;
a cover plate arranged on the chassis bending part and facing the IC chip;
a chip heat-dissipating sheet arranged between the IC chip and the cover plate, the chip-heat dissipating sheet comprising graphite, the chip heat-dissipating sheet being adapted to conduct heat produced by the IC chip away from the IC chip; and
a thermally conductive member, the chip heat-dissipating sheet being arranged within a completely enclosed sealed space, the sealed space being defined by the thermally conductive member in contact with another member, the sealed space preventing contamination of a remainder of the plasma display module by graphite particles from the chip heat-dissipating sheet.

13. An apparatus, comprising:
a chassis comprising a reinforcing member and a chassis base;
an integrated circuit chip (IC chip) contacting the reinforcing member and connected to a signal transmitting member;
a cover plate arranged on the reinforcing member and facing the IC chip;
a chip heat-dissipating sheet arranged between the IC chip and the cover plate, the chip-heat dissipating sheet comprising graphite; and
a thermally conductive member also arranged between the IC chip and the cover plate, the thermally conductive member and another member defining a sealed space that encapsulates the chip-heat dissipating sheet, the sealed space preventing particles from the chip-heat dissipating sheet from escaping to an outside of the sealed space.

14. The apparatus of claim 13, wherein the reinforcing member is arranged at an edge of the chassis.

15. The apparatus of claim 13, wherein the chip heat-dissipating sheet comprises one adhesive surface.

16. The apparatus of claim 13, wherein the thermally conductive member is a foil.

17. The apparatus of claim 13, wherein the another member being the cover plate, and at least a portion of the thermally conductive member contacts the IC chip.

18. The apparatus of claim 13, wherein the chip heat-dissipating sheet is arranged to contact the IC chip, the another member being the signal transmitting member, the IC chip also being within the sealed space, and at least a portion of the thermally conductive member contacts the cover plate.

19. The apparatus of claim 13, wherein the another member being the IC chip, and at least a portion of the thermally conductive member contacts the cover plate.

20. The apparatus of claim 13, wherein the thermally conductive member comprises copper.

21. The apparatus of claim 13, wherein the thermally conductive member comprises aluminum.

22. The apparatus of claim 13, wherein the thermally conductive member comprises one adhesive surface.

23. The apparatus of claim 13, further comprising a thermal grease arranged between the IC chip and the reinforcing member of the chassis.

24. A plasma display module, comprising:
a plasma display panel adapted to display visible images via gas discharge;
a chassis adapted to support the plasma display panel, the chassis comprising a reinforcing member and a chassis base;
an integrated circuit chip (IC chip) contacting the reinforcing member;
a signal transmitting member connected to the IC chip and adapted to deliver electrical signals to the plasma display panel to drive the plasma display panel;
a cover plate arranged on the reinforcing member and facing the IC chip;
a chip heat-dissipating sheet arranged between the IC chip and the cover plate, the chip-heat dissipating sheet comprising graphite; and
a thermally conductive member also arranged between the IC chip and the cover plate, the thermally conductive member, together with another member, adapted to enclose the chip heat-dissipating sheet so that material from the chip heat-dissipating sheet can not contaminate other portions of the plasma display module.

* * * * *